United States Patent
Lee et al.

(10) Patent No.: US 6,168,068 B1
(45) Date of Patent: Jan. 2, 2001

(54) METHOD FOR PREVENTING A GOLD PLATE CONNECTOR ON A PCB FROM BEING CONTAMINATED

(75) Inventors: Gun-Yong Lee; Masaharu Tsukue; Choul-Su Kim, all of Suwon (KR)

(73) Assignee: Samsung Electronic Co, Ltd., Suwon (KR)

( * ) Notice: Under 35 U.S.C. 154(b), the term of this patent shall be extended for 0 days.

(21) Appl. No.: 09/146,942

(22) Filed: Sep. 3, 1998

(30) Foreign Application Priority Data

Sep. 3, 1997 (KR) .................................................. 97/45583

(51) Int. Cl.[7] ............................. B23K 1/20; B23K 31/00; B23K 31/02; B23K 35/38
(52) U.S. Cl. ..................... 228/118; 228/180.21; 228/214; 228/219; 228/223
(58) Field of Search .............................. 228/118, 180.21, 228/214, 219, 223, 233.2, 256, 260

(56) References Cited

U.S. PATENT DOCUMENTS

| | | | |
|---|---|---|---|
| 3,753,720 * | 8/1973 | Kloczewski et al. | 96/115 R |
| 3,934,334 * | 1/1976 | Hanni | 29/625 |
| 3,948,736 | 4/1976 | Russell . | |
| 3,984,244 * | 10/1976 | Collier et al. | 96/67 |
| 4,004,042 | 1/1977 | Fairbairn . | |
| 4,127,692 * | 11/1978 | Boynton | 428/137 |
| 4,196,839 * | 4/1980 | Davis | 228/180 R |
| 4,457,466 * | 7/1984 | Ahmann et al. | 228/57 |
| 4,775,573 * | 10/1988 | Turek | 428/209 |
| 5,121,875 * | 6/1992 | Hagerty et al. | 228/219 |
| 5,172,853 * | 12/1992 | Maiwald | 228/248 |
| 5,190,486 | 3/1993 | Tsuk . | |
| 5,350,323 | 9/1994 | Boissel et al. . | |
| 5,535,936 * | 7/1996 | Chong et al. | 228/175 |
| 5,650,088 | 7/1997 | Kodama . | |
| 5,672,394 | 9/1997 | Hardee et al. . | |
| 5,728,431 | 3/1998 | Bergbreiter et al. . | |

FOREIGN PATENT DOCUMENTS

| | | |
|---|---|---|
| 0159873 A2 * | 10/1985 | (GB) . |
| 0159873A2 * | 10 1985 | (EP) . |
| 02099572 * | 4/1990 | (JP) . |

* cited by examiner

*Primary Examiner*—Patrick Ryan
*Assistant Examiner*—Zidia T. Pittman
(74) *Attorney, Agent, or Firm*—Robert E. Bushnell, Esq.

(57) ABSTRACT

Disclosed is a method of preventing a gold plate connector of a printed circuit board (PCB) from being contaminated during a soldering process. The disclosed method prevents the gold plate connector coupled with the printed circuit board from being contaminated during wave soldering of the printed circuit board after spreading flux over the printed circuit board on which electronic components are mounted, and the method includes the steps of: forming a strip mask in a form of a membrane by solidifying a masking solution after spreading the masking solution capable of being solidified over the gold plate connector of the printed circuit board, performing the spreading of the masking solution before the spreading of the flux; and removing the strip mask from the gold plate connector after performing the wave soldering. As a result, it is not necessary to perform a washing operation of the gold plate connector. The washing operation can be troublesome, time-consuming, and inconvenient. The present invention causes the time required for performing an entire process upon the printed circuit board to be shortened, and productivity and efficiency to be enhanced.

17 Claims, 5 Drawing Sheets

METHOD FOR PREVENTING A GOLD PLATE CONNECTOR ON A PCB FROM BEING CONTAMINATED

CLAIM OF PRIORITY

This application makes reference to, incorporates the same herein, and claims all benefits accruing under 35 U.S.C. §119 from an application entitled a Methodfor Preventing a Gold Plate Connector on a Pcb from Being Contaminated earlier filed in the Korean Industrial Property Office on the $3^{rd}$ day of September 1997, and there duly assigned Ser. No. 45583/1997, a copy of which is annexed hereto.

BACKGROUND OF THE INVENTION

1. Technical Field

The present invention relates to a method of preventing contamination of a connector on a printed circuit board, and more particularly to a method of preventing a gold plate connector on a printed circuit board from being contaminated during a soldering process using wave soldering.

2. Related Art

Generally, various electronic components are mounted on a printed circuit board (PCB). Those electronic components are classified as surface mount technology (SMT) components which are directly soldered to a copper-coated pad on a surface of a substrate and also classified as pin-through-hole components or printed board assembly (PBA) components which are soldered after being inserted into a copper-coated hole of the substrate, according to the method of mounting the electronic components on the printed circuit board. Those components are soldered through different soldering methods and then mounted on the printed circuit board.

Here, as soldering methods for printed board assembly (PBA) components, there is a wave soldering method which also called a flow soldering process. The wave soldering is a method of soldering the printed board assembly components which are inserted in the copper-coated hole by dipping the printed circuit board in a bath where a melted liquid lead is contained.

A gold electrical connector coupled with a printed circuit board can become contaminated with lead, flux, and floating gas particles during a wave soldering process. The gold electrical connector can sometimes be washed after the wave soldering process. However, the washing operations are generally complicated and inconvenient and require much time and effort. In addition, the washing causes an economic burden due to the preparation of washing apparatuses thereof. Most of all, much more time is required to perform the entire process due to the additional operation of washing the gold plate connector, and the efficiency of soldering the printed circuit board is thereby curtailed. The aforementioned problems are caused by the contamination of the gold plate connector.

Exemplars of recent efforts in the art include U.S. Ser. No. 08/881,566 for Apparatus to Clean Golden Plates invented by Woo-Sig KIM, et al., U.S. Pat. No. 5,728,431 for a Processfor Forming Self-assembled Polymer Layers on a Metal Surface issued to Bergbreiter et al., U.S. Pat. No. 5,672,394 for Electrodes of Improved Service Life issued to Hardee et al., U.S. Pat. No. 5,650,088 for a Treating Solution for Gold-plated Material issued to Kodama, U.S. Pat. No. 5,350,323 for a Contactfor an Electrical Connector Protected by a Polymer Film and its Production Process issued to Boissel et al., U.S. Pat. No. 5,190,486 for Selectively Plating Electrically Conductive Pin issued to Tsuk, U.S. Pat. No. 4,004,042 for a Method for Applying a Wear and Impact Resistant Coating issued to Fairbaim, and U.S. Pat. No. 3,948,736 for a Method of Selective Electroplating and Products Produced Thereby issued to Russell.

While these recent efforts provide advantages, I note that they fail to adequately provide an efficient method for preventing a gold plate connector on a printed circuit board from being contaminated.

SUMMARY OF THE INVENTION

Therefore, it is an object of the present invention to prevent the adhesion of a lead to a gold plate connector during a soldering process and prevent the permeation of a flux and the contamination of the gold plate connector caused by floating gas particles generated in the case of wave soldering, so that a troublesome and inconvenient operation of washing the gold plate connector cannot be performed.

According to one aspect of the present invention, the soldering process for performing the wave soldering on a printed circuit board (PCB) after spreading flux over the printed circuit board on which electronic components are mounted, includes the steps of: forming a strip mask in form of a membrane by solidifying a masking solution after spreading the masking solution capable of being solidified over the gold plate connector of the printed circuit board, before spreading the flux; and removing the strip mask from the gold plate connector, after performing the wave soldering. Preferably, the masking solution is made of a vinyl-based material.

Selectively, at step of forming the strip mask, in order to facilitate the solidification of the masking solution, the printed circuit board is dried at a predetermined temperature in a predetermined time after spreading the masking solution. Generally, the predetermined temperature is 150 degrees Celsius (150° C.) to 180 degrees Celsius (180° C.). It is proper to set the predetermined time as two to three minutes. Especially, it is applied in the case of using the masking solution made of the vinyl-based material.

In the soldering process using the wave soldering according to the present invention, when the masking solution is spread over the gold plate connector of the printed circuit board before spreading the flux and then it is solidified, the strip mask in form of a membrane is produced at the gold plate connector. At this time, since the gold plate connector is protected by the strip mask, the lead is not adhered and the flux is not permeated. Moreover, the gold plate connector is not contaminated by the floating gas particles.

The strip mask formed at the gold plate connector by spreading and solidifying the masking solution is easily stripped from the gold plate connector after finishing the wave soldering. In addition, in the case that the strip mask is stripped from the gold plate connector, there are no remainders on the gold plate connector, and thereby a separate washing operation for the gold plate connector is not required.

To achieve these and other objects in accordance with the principles of the present invention, as embodied and broadly described, the present invention provides a method preventing a surface from being contaminated, comprising the steps of: forming a membrane on a first plurality of electrical terminals coupled to a printed circuit board; applying flux to a second plurality of electrical terminals adjacent to said printed circuit board, said membrane preventing said flux from contacting said first plurality of terminals; applying a heated liquid solder to said second plurality of electrical terminals, said membrane preventing said liquid solder from contacting said first plurality of electrical terminals, and said membrane preventing gaseous particles from contacting said first plurality of electrical terminals; and removing said membrane from said first plurality of electrical terminals.

To achieve these and other objects in accordance with the principles of the present invention, as embodied and broadly described, the present invention provides a method preventing a surface from being contaminated, comprising the steps of: applying a first substance to a first plurality of electrical terminals coupled to a printed circuit board, said first substance forming a membrane on said first plurality of electrical terminals; applying a second substance to a second plurality of electrical terminals adjacent to said printed circuit board, said second substance cleaning said second plurality of electrical terminals and promoting a coupling of said second plurality of electrical terminals to said printed circuit board, said membrane preventing said second substance from permeating into said first plurality of terminals; applying a third substance to said second plurality of electrical terminals to perform said coupling of said second plurality of electrical terminals to said printed circuit board, said membrane preventing said third substance from adhering to said first plurality ofelectrical terminals, and said membrane preventing gaseous particles from contaminating said first plurality of electrical terminals; and removing said membrane from said first plurality of electrical terminals.

To achieve these and other objects in accordance with the principles of the present invention, as embodied and broadly described, the present invention provides a method preventing a surface from being contaminated, comprising the steps of: applying a first substance to a first surface of a printed circuit board, said first substance forming a membrane on said first surface; applying a primary substance to said second surface adjacent to said printed circuit board to perform a coupling of said second surface to said printed circuit board, said membrane preventing said primary substance from contacting said first surface; and removing said membrane from said first surface.

The present invention is more specifically described in the following paragraphs by reference to the drawings attached only by way of example.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

Figure 1:
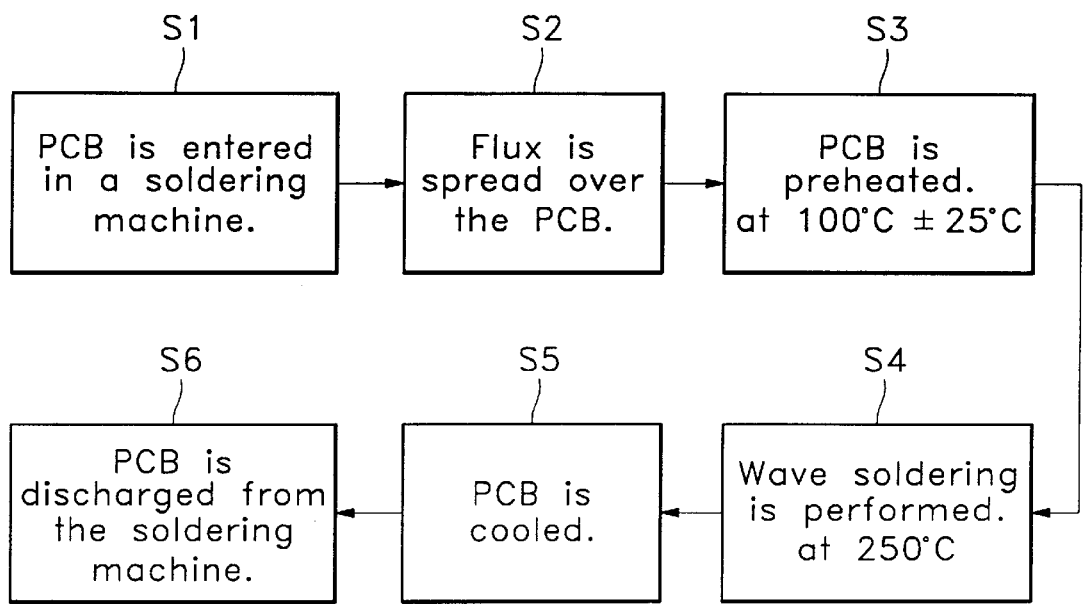
FIG. 1 is a view illustrating a sequence of a soldering process.

Turn now to the drawings, and refer to FIG. 1, which is a view illustrating a sequence of a soldering process. Referring to FIG. 1, at step S1, a printed circuit board is entered in a soldering machine after the printed board assembly components are inserted into the printed circuit board. At step S2, when the printed circuit board passes through a flux bath, flux which is a solvent for soldering is spread over the printed circuit board. At step S3, the printed circuit board is preheated at around 100 degrees Celsius (100° C.) by a preheater. At step S4, the wave soldering is performed by dipping the printed circuit board into the melted lead having the temperature of 250 degrees Celsius (250° C.). At step S5, the printed circuit board which finishes the wave soldering is cooled. At step 6, the printed circuit board is discharged from the soldering machine.

Figure 2:
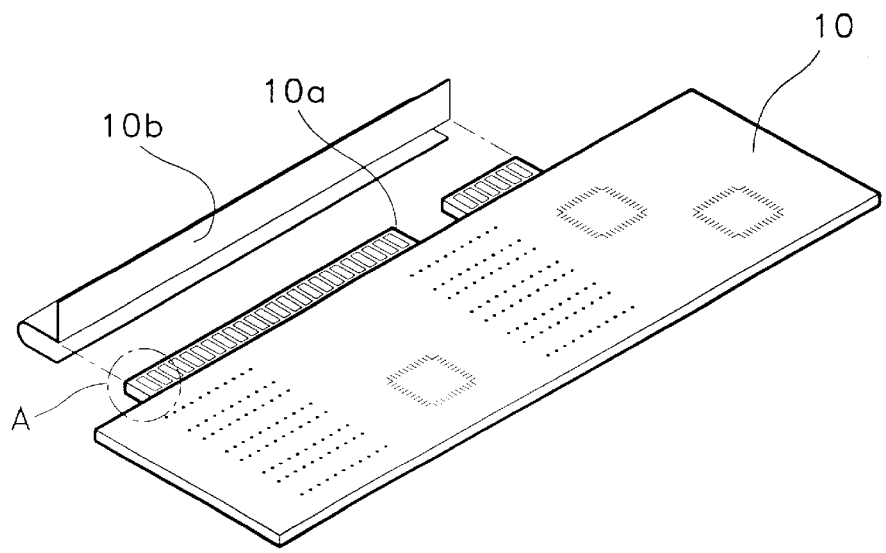
FIG. 2 is a view illustrating a printed circuit board and a clip which is inserted into a gold plate connector of the printed circuit board for wave soldering.

Refer now to FIG. 2, which is a view illustrating a printed circuit board and a clip which is inserted into a gold plate connector of the printed circuit board for wave soldering. A printed circuit board 10 which is manufactured for an option board for expanding functions in a personal computer includes a gold plate connector 10a which is inserted into a slot of a main board so as to exchange the signal with the main board of the personal computer, as illustrated in FIG. 2.

In FIG. 2, since the lead should not be adhered to the gold plate connector 10a of the printed circuit board, a clip 10b is inserted onto the gold plate connector 10a, thereby preventing a soldering process from directly impacting the gold plate connector 10a. At this time, the clip 10b prevents the lead from being directly adhered to the gold plate connector 10a.

Figure 3:
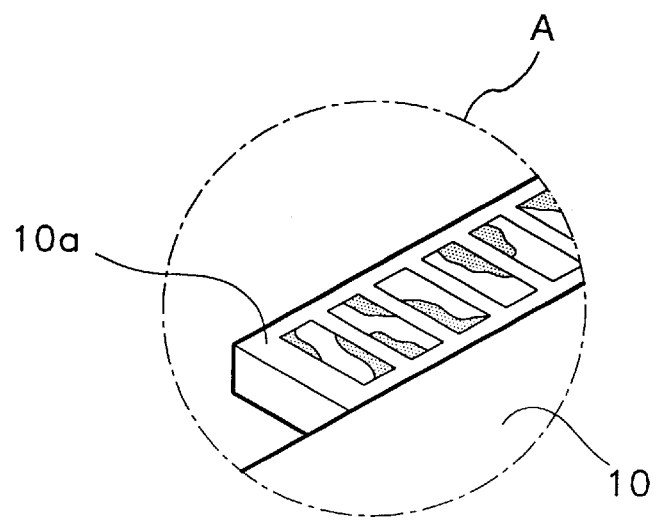
FIG. 3 is a view enlarging a portion A of FIG. 2.

Refer now to FIG. 3, which is a view enlarging a portion A of FIG. 2. As shown in FIG. 3, it is impossible to prevent the gold plate connector 10a from being contaminated by floating gas particles which are generated in the case of wave soldering or the permeation of the flux to the gold plate connector 10a. Here, since the contamination causes the contact error between the option board and the main board by degenerating the electrical contact between the gold plate connector 10a and the slot, the contamination should be removed through washing.

Figure 4:
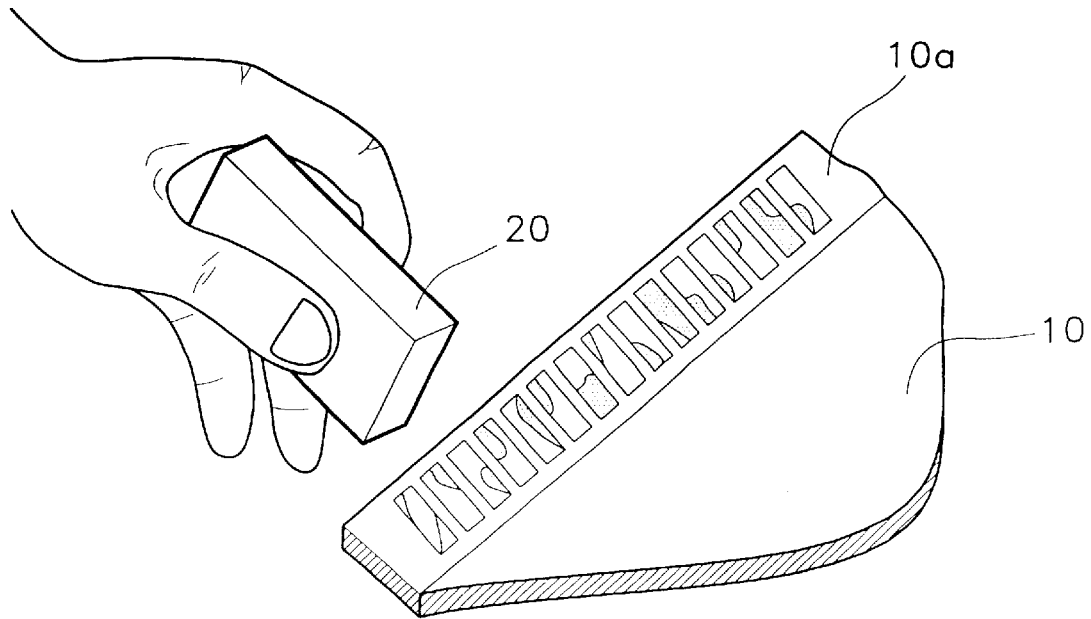
FIG. 4 is a view illustrating a method of washing a gold plate connector which is contaminated.

Refer now to FIG. 4, which is a view illustrating a method of washing a gold plate connector which is contaminated. As shown in FIG. 4, a method of removing the contamination of the gold plate connector 10a using an eraser 20 is used. However, since it is impossible to efficiently remove the contamination using this method, other methods of removing the contamination are introduced. For example, a method of using a separate washing device (U.S. Ser. No. 08/881,566, Korean Application No. 96-23292) is disclosed.

Moreover, in order to prevent the adhesion of the lead, the soldering process is performed by attaching a masking tape instead of the clip to the gold plate connector 10a. In this case, when the masking tape is detached from the gold plate connector after the wave soldering, small residues of the masking tape remain at the gold plate connector, and thereby it requires a washing operation of the gold plate connector as described above.

Figure 5:
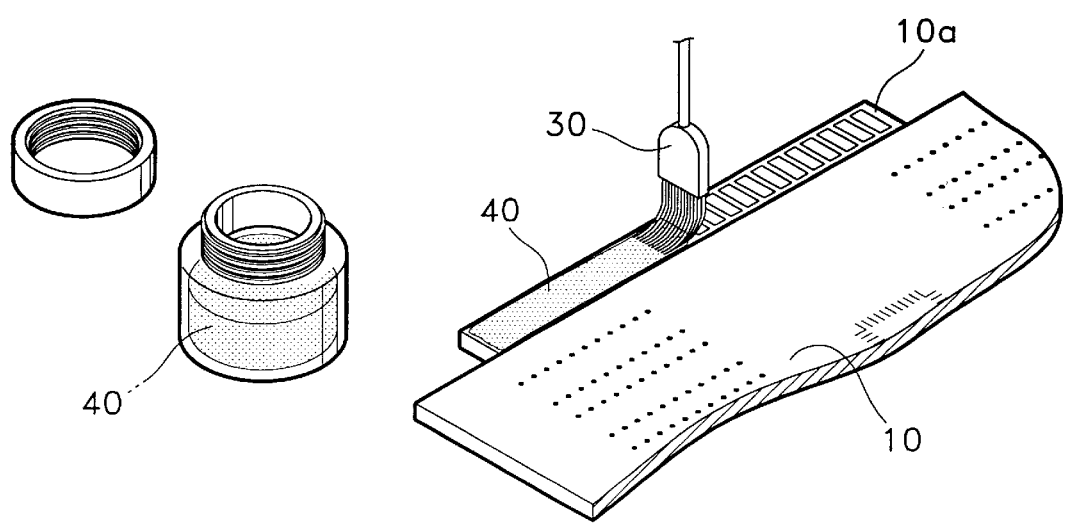
FIG. 5 is a view illustrating a method of spreading a masking solution on a gold plate connector, in accordance with the principles of the present invention.

The objects, characteristics and advantages of the present invention will be more clearly understood through the preferable embodiments referring to the attached drawings. Refer now to FIG. 5, which is a view illustrating a method of spreading a masking solution on a gold plate connector, in accordance with the principles of the present invention. In addition, refer to FIG. 6, which is a view illustrating the state that a strip mask is formed at the gold plate connector, in accordance with the principles of the present invention. Also, refer to FIG. 7, which is a view illustrating a method of removing the strip mask from the gold plate connector, in accordance with the principles of the present invention.

Figure 6:
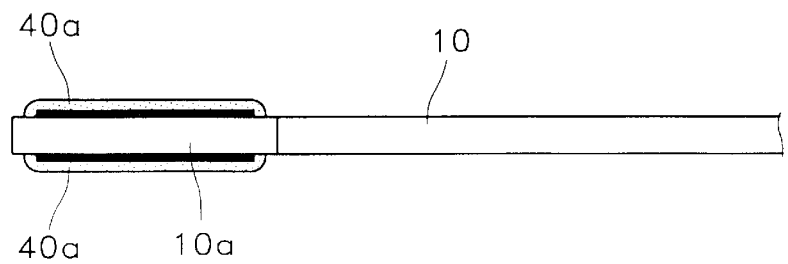
FIG. 6 is a view illustrating the state that a strip mask is formed at the gold plate connector, in accordance with the principles of the present invention.
Figure 7:
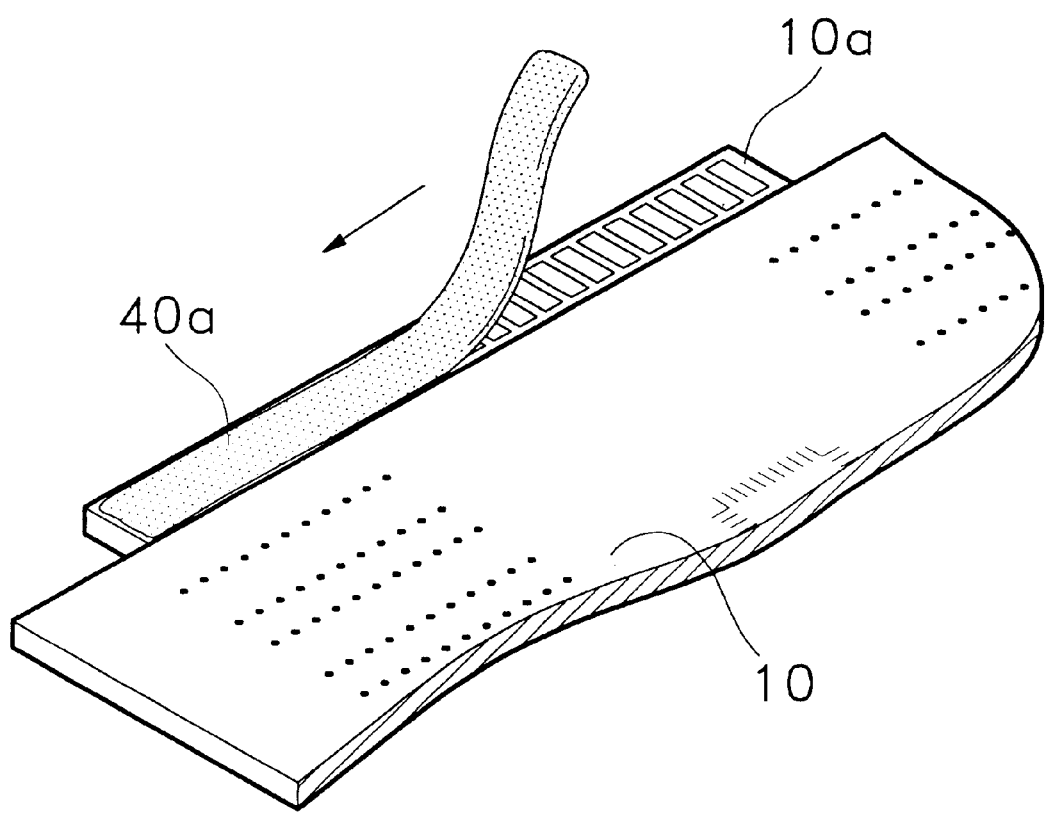
FIG. 7 is a view illustrating a method of removing the strip mask from the gold plate connector, in accordance with the principles of the present invention.

Referring to FIGS. 5 to 7, a method of forming/removing a strip mask at/from a gold plate connector according to the principles of the present invention will be explained. It is quite simple to form the strip mask at the gold plate connector according to the principles of the present invention. As shown in FIG. 5, a masking solution 40 capable of being solidified which is made of a vinyl-based material is spread over the gold plate connector 10a of a printed circuit board (PCB) 10 using a spread unit such as a brush 30. Generally, the printed circuit board has the gold plate connector 10a at both sides, and the masking solution 40 is spread over all of the gold plate connector 10a. After that, the masking solution 40 is dried and then solidified. At this time, a membrane, that is, the strip mask 40a of FIG. 6 is formed at the gold plate connector 10a.

As described, in the case that the strip mask 40a is formed at the gold plate connector 10a of the printed circuit board 10, even when flux is spread on the printed circuit board 10 and then the wave soldering is performed, the flux does not permeate into the gold plate connector 10a and the lead does not adhere to the gold plate connector. Moreover, the gold plate connector 10a is not contaminated by floating gas particles generated in the wave soldering.

The method of removing the strip mask from the printed circuit board 10 which finishes the wave soldering is simpler than that of forming the strip mask. As shown in FIG. 7, the strip mask 40a is simply stripped from the gold plate connector 10a of the printed circuit board 10. At this time, since the strip mask 40a is made by solidifying the paint of vinyl resin, it is easily stripped from the gold plate connector 10a without leaving any remainders. At this time, it is possible to see the gold plate connector 10a which is glittering without being contaminated. Accordingly, any separate washing operation for the gold plate connector is not required.

Figure 8:
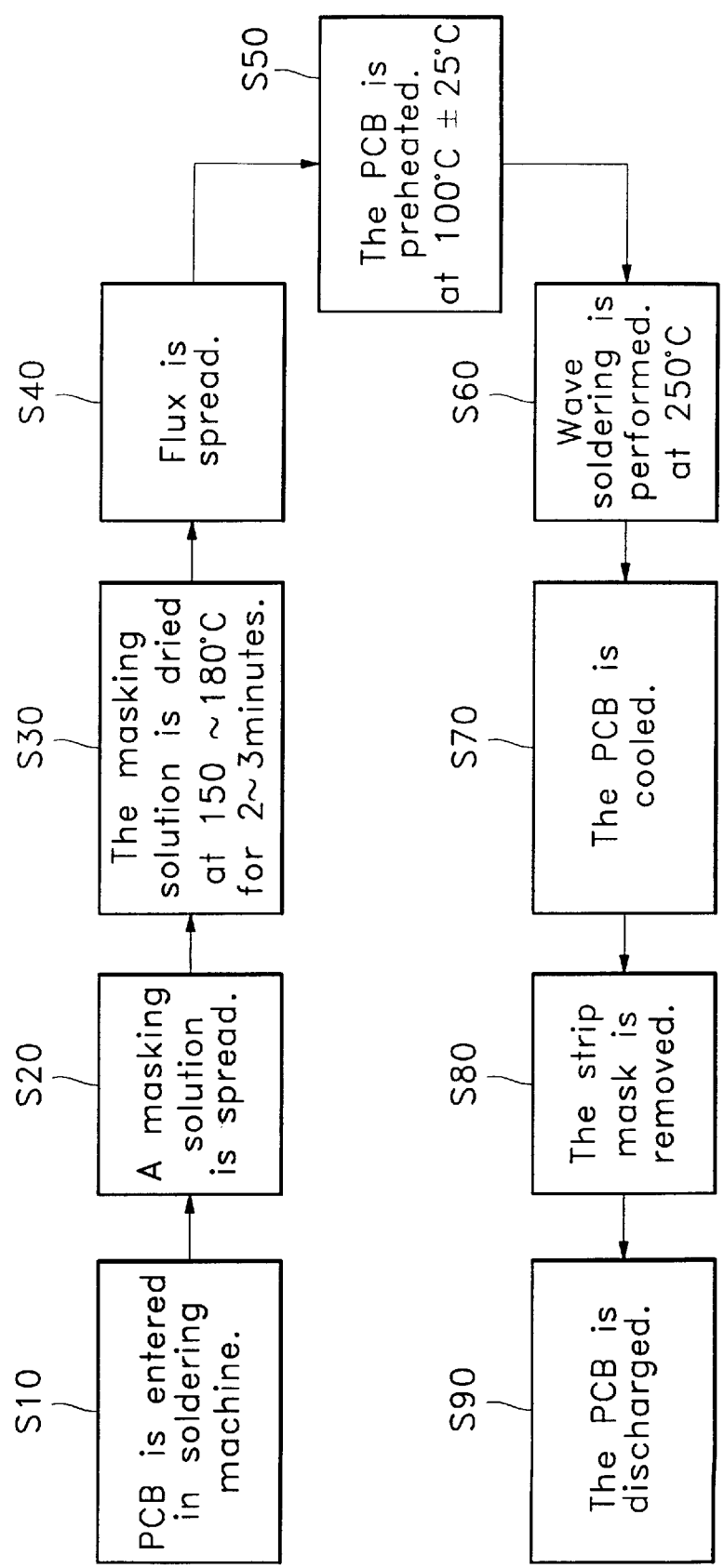
FIG. 8 is a view illustrating a sequence of a soldering process applying a method of preventing the gold plate connector of the printed circuit board from being contaminated, in accordance with the principles of the present invention.

Refer now to FIG. 8, which is a view illustrating a sequence of a soldering process applying a method of preventing the gold plate connector of the printed circuit board from being contaminated, in accordance with the principles of the present invention. The method of preventing the contamination of the gold plate connector in the soldering process is explained as follows. FIG. 8 is a view illustrating the soldering process applying the method of prevention the contamination of the gold plate connector in the printed circuit board. At step S10, the printed circuit board 10 enters the soldering machine. At step S20, the masking solution 40 is spread over the gold plate connector 10a. At step S30, the masking solution 40 is dried. At step S40, the flux is spread. At step S50, the printed circuit board is preheated at around 100° C. At step S60, the wave soldering is performed. At step S70, the printed circuit board which finishes the wave soldering is cooled. At step S80, the strip mask 40a is removed. At step S90, the printed circuit board 10 is discharged from the soldering machine.

That is, in the soldering process of the present invention, before spreading the flux at step S40, steps S20 and S30 are further added to the soldering process shown in FIG. 1. In addition, after cooling the printed circuit board at step S70, the strip mask 40a is removed at step S80.

Hereinbelow, the method according to the principles of the present invention is explained in more detail, with further reference to FIG. 8. At step S10, the printed circuit board is entered in the soldering machine after the printed board assembly components are inserted into the printed circuit board 10, and then at step S20 the masking solution 40 is spread over the gold plate connector 10a. Then, at step S30, the masking solution 40 is dried during two to three minutes under the temperature of 150° C. to 180° C. After the masking solution 40 is dried, the strip mask 40a is formed at the gold plate connector 10a.

In fact, the masking solution 40 spread over the gold plate connector 10a will become solidified at the normal temperature of 25 degrees Celsius (25° C.). However, at 25° C. it takes three to four hours to solidify the masking solution 40 completely. Thus, the masking solution 40 is dried in the aforesaid condition at 150° C. to 180° C. to facilitate the solidification of the masking solution 40. Accordingly, the strip mask 40a is rapidly formed.

At step S40 as described above, when the printed circuit board 10 wherein the strip mask 40a is formed in the gold plate connector 10a passes through the flux bath, the flux which is the solvent for soldering is spread. At this time, since the gold plate connector 10a is protected by the strip mask 40a, the flux is not permeated into the gold plate connector.

At step S50, the printed circuit board 10 is preheated to about 100° C. by the preheater. At step S60, the wave soldering is performed by dipping the printed circuit board 10 into the melted lead having the temperature of 250° C. In this case, the gold plate connector 10a is protected by the strip mask 40a, the lead is not adhered and it is not contaminated by the floating gas particles. At step S70, the printed circuit board 10 which finishes the wave soldering is cooled. At step S80, the strip mask 40a is removed from the gold plate connector 10a of the printed circuit board 10. At step S90, the printed circuit board 10 is discharged from the soldering machine. The gold plate connector 10a of the printed circuit board 10 which finishes the soldering process is clean and is not contaminated. Accordingly, it is not necessary to perform the separate washing operation.

As described above, according to the present invention, the lead is not adhered to the gold plate connector of the printed circuit board and the flux is not permneated into the gold plate connector. In addition, the gold plate connector is not contaminated by the floating gas particles generated in the case of the wave soldering. As a result, it is not necessary to perform the washing operation which is troublesome and inconvenient. Since the washing is no longer necessary, the time required for performing the entire process is shortened. And productivity and efficiency are enhanced.

The foregoing paragraphs describe the details of a method of preventing a gold plate connector on a printed circuit board (PCB) from being contaminated during a soldering process using a wave soldering, and more particularly to a method of completely preventing a gold plate connector on a printed circuit board from being contaminated by floating gas particles generated in the wave soldering as well as preventing the adhesion of a lead and permeation of flux, by performing the wave soldering after forming a strip mask in the form of a membrane after spreading a masking solution capable of being solidified over the gold plate connector.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment disclosed as the best mode contemplated for carrying out the present invention, but that the present invention includes all embodiments falling within the scope of the appended claims.

What is claimed is:

1. A method of soldering a printed circuit board having a gold plate connector, comprising the steps of:
    coating a masking solution over the gold plate connector of a printed circuit board;
    drying the masking solution to form a strip mask over said gold plate connector; then
    applying flux to the printed circuit board in a wave soldering machine;
    preheating the fluxed printed circuit board in the wave soldering machine;
    wave soldering the preheated printed circuit board in the wave soldering machine; and
    peeling the strip mask from the gold plate connector of the soldered printed circuit board in the wave soldering machine.

2. The method of claim 1, said masking solution being a vinyl-resin paint.

3. The method of claim 1, said step of coating the masking solution being performed by brushing on the masking solution.

4. The method of claim 2, said step of coating the masking solution being performed by brushing on the masking solution.

5. The method of claim 1, said step of coating the masking solution comprising coating both sides of the gold plate connector.

6. The method of claim 1, said step of applying flux comprising passing the printed circuit board through a flux bath.

7. The method of claim 1, said step of wave soldering comprising dipping the circuit board into molten solder at approximately 250° C.

8. The method of claim 7, the gold plate connector region of the printed circuit board being above the molten solder during the step of dipping the circuit board into molten solder.

9. A method of soldering a printed circuit board having a gold plate connector, comprising the steps of:
    coating a masking solution over the gold plate connector of a printed circuit board in a wave soldering machine;
    drying the masking solution to form a strip mask over said gold plate connector; then
    applying flux to the printed circuit board in the wave soldering machine;
    preheating the fluxed printed circuit board in the wave soldering machine;
    wave soldering the preheated printed circuit board in the wave soldering machine; and
    peeling the strip mask from the gold plate connector of the soldered printed circuit board.

10. The method of claim 1, said step of drying the masking solution comprising heating the coated gold plate connector for a predetermined period of time.

11. The method of claim 10, said step of drying the masking solution comprising heating the coated gold plate connector to a temperature in the range of 150 to 180° C.

12. The method of claim 10, said step of drying the masking solution comprising heating the coated gold plate connector for a period of approximately 2 to 3 minutes.

13. The method of claim 1, further comprising the step of:
    before coating the masking solution on the gold plate connector, inserting printed circuit board assembly components into the printed circuit board.

14. The method of claim 1, said step of preheating the printed circuit board comprising heating the printed circuit board to a temperature in the range of approximately 75 to 125° C.

15. The method of claim 14, said step of preheating the printed circuit board comprising heating the printed circuit board to approximately 100° C.

16. A method of soldering a printed circuit board having a gold plate connector, comprising the steps of:
    coating a masking solution over the gold plate connector of a printed circuit board;
    drying the masking solution to form a strip mask over said gold plate connector; then
    applying flux to the printed circuit board;
    preheating the fluxed printed circuit board;
    wave soldering the preheated printed circuit board;
    cooling the soldered printed circuit board; and then
    peeling the strip mask from the gold plate connector of the soldered printed circuit board.

17. The method of claim 9, further comprising the step of:
    before peeling the strip mask, cooling the soldered printed circuit board.

* * * * *